(12) United States Patent
Pascoguin et al.

(10) Patent No.: US 11,035,925 B2
(45) Date of Patent: *Jun. 15, 2021

(54) DEVICE, SYSTEM, AND METHOD FOR CONTROLLING THE FOCUS OF A LASER TO INDUCE PLASMAS THAT EMIT SIGNALS WITH HIGH DIRECTIVITY

(71) Applicant: United States Government as represented by the Secretary of the Navy, San Diego, CA (US)

(72) Inventors: Bienvenido Melvin L. Pascoguin, La Mesa, CA (US); Ryan P. Lu, San Diego, CA (US); Ayax D. Ramirez, Chula Vista, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 482 days.

This patent is subject to a terminal disclaimer.

(21) Appl. No.: 16/058,758

(22) Filed: Aug. 8, 2018

(65) Prior Publication Data
US 2020/0049788 A1 Feb. 13, 2020

(51) Int. Cl.
*G01S 1/76* (2006.01)
*G01S 15/88* (2006.01)
*H01J 37/32* (2006.01)

(52) U.S. Cl.
CPC .............. *G01S 1/76* (2013.01); *G01S 15/88* (2013.01); *H01J 37/32412* (2013.01)

(58) Field of Classification Search
CPC .. G01S 1/76; G01S 15/88; G01S 7/524; H01J 37/32412

USPC ......................................................... 367/131
See application file for complete search history.

(56) References Cited

U.S. PATENT DOCUMENTS

| 7,260,023 | B2 | 8/2007 | Jones et al. | |
|---|---|---|---|---|
| 8,223,590 | B2* | 7/2012 | Jones | G01V 11/00 367/128 |
| 2011/0088474 | A1 | 4/2011 | Jones et al. | |
| 2012/0147701 | A1* | 6/2012 | Ross | G01V 1/005 367/23 |
| 2020/0098348 | A1* | 3/2020 | Pascoguin | G10K 11/26 |

OTHER PUBLICATIONS

Moreno et al., "Encoding generalized phase functions on Dammann gratings," Opt. Lett. 35, 1536-1538 (2010).
Davis et al., "Fourier transform pupil functions for modifying the depth of focus of optical imaging systems," Appl. Opt. 48, 4893-4898 (2009).
Brelet et al., "Underwater acoustic signals induced by intense ultrashort laser pulse," The Journal of the Acoustical Society of America 137, EL288 (2015).
Wang et al., "Creation of identical multiple focal spots with three-dimensional arbitrary shifting," Optics Express, vol. 25, No. 15 (2017).

* cited by examiner

*Primary Examiner* — Daniel L Murphy
(74) *Attorney, Agent, or Firm* — Naval Information Warfare Center, Pacific; Kyle Eppele; Matthew D. Pangallo

(57) ABSTRACT

A focus controlling component is configured to control a focus of a laser beam that passes through water and induces plasmas that emit signals. The focus of the laser beam is controlled such that the signals emitted by the induced plasmas interfere to form a combined signal that propagates in a desired direction.

20 Claims, 3 Drawing Sheets

FIG. 2

DEVICE, SYSTEM, AND METHOD FOR CONTROLLING THE FOCUS OF A LASER TO INDUCE PLASMAS THAT EMIT SIGNALS WITH HIGH DIRECTIVITY

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc pac t2@t2@navy.mil, referencing NC 103667.

FIELD OF THE INVENTION

The present invention pertains generally to laser induced signal emitting plasmas. More particularly, the present invention pertains to controlling a focus of a laser to induce plasmas under water that emit signals with high directivity.

BACKGROUND

Research has shown that underwater sonar sources may be generated by pulsing laser beams into water. With a laser-based approach, lasers may be directed toward the water remotely, and no hardware needs to touch the water. This provides for a stealthy and durable way for aircraft to communicate with submarines.

When a laser beam penetrates the surface of the water, it causes the molecules around it to turn into superhot plasma. This forces some of the electrons in the molecules to break free, ionizing the water and causing it to expand in a shock wave. These waves can then be detected by acoustic sensors in the water. In this manner, lasers have been shown to produce underwater sonar sources.

Generation of a sonar source by a laser may be understood with reference to FIG. 1. As shown in FIG. 1, a high energy laser beam 120 that is on the order of approximately 10-100 joules is generated by a laser source 110. The laser beam is focused towards water. Due to the Kerr effect, the high energetic laser beam 120 induces a series of plasmas 130 as it passes through the water. The plasmas 130 emit signals 140 including sonar signals and electromagnetic signals.

In the system shown in FIG. 1, the laser beam 120 is directed towards a single point in the water. This, in turn induces plasmas 130 having a circular shape. As can be seen from FIG. 1, as a result, the signals 140 emitted by the plasmas 130 are isotropic. That is, the signals 140 radiate from the plasmas 130 with equal strength in all directions. Accordingly, the laser generated underwater sonar signals have a low directivity. As a result, the sonar signals are sent to too many locations, and the probability of interception of the sonar signals by unintended recipients is high.

In view of the above, it would be desirable to ensure that a laser generated signal under water only arrives at the intended target.

SUMMARY

According to an illustrative embodiment, a focus controlling component is configured to control a focus of a laser beam that passes through water and induces plasmas that emit signals. The focus of the laser beam is controlled such that the signals emitted by the induced plasmas interfere to form a combined signal that propagates in a desired direction.

These, as well as other objects, features and benefits will now become clear from a review of the following detailed description, the illustrative embodiments, and the accompanying drawings.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

According to an illustrative embodiment, plasmas are induced by a laser in water in a manner such that signals emitted by the plasmas form a combined signal having a desired propagation direction. This is achieved by using a focus controlling component to control the focus of the laser beam to have a three dimensional focal pattern with multiple foci. By selecting and adjusting the focal pattern, the shape of the induced plasma can be controlled to cause the plasma to emit signals with high directivity. These emitted signals interfere to form the combined signal that propagates in a desired direction. In this manner, the combined signal formed from the signals emitted by the plasmas can be steered and refined as desired. This ensures that the combined signal only arrives at the intended target.

Figure 2:
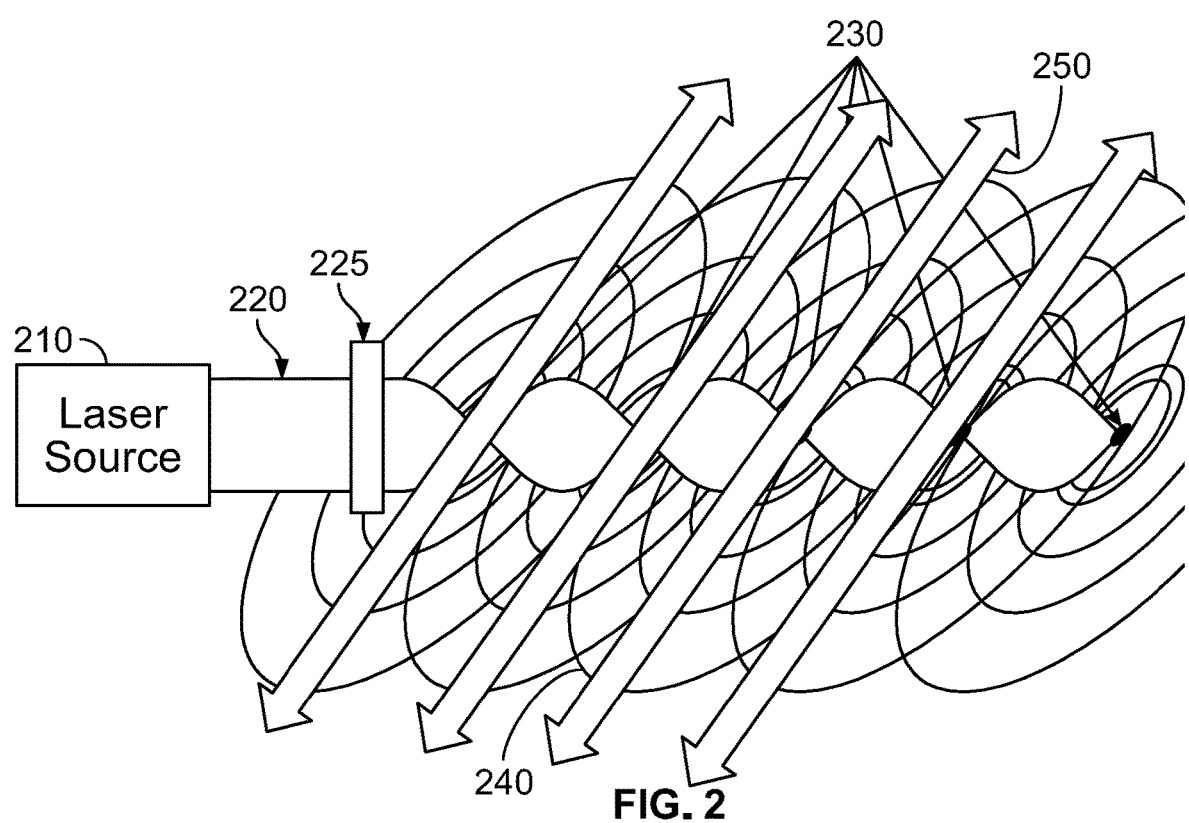
FIG. 2 illustrates a system for generating a sonar source under water using a laser with a controlled focus according to an illustrative embodiment.

FIG. 2 illustrates a system for generating a sonar source under water using a laser with a controlled focus according to an illustrative embodiment. The system includes a high power laser source 210 configured to generate and output a laser beam 220. The laser source 210 may be any commercial laser source that emits lasers having a power of 10-100 joules.

The system also includes a focus controlling component 225 configured to control the focus of the laser beam 220. The laser source 210 and/or the focus controlling component 225 may be located in air or another gaseous medium, with the laser beam 220 directed toward a water surface. Alternatively, the laser source 210 may be located in water along with the focus controlling component 225, and the laser beam 220 may propagate through water from the laser source 210 after passing through the focus controlling component 225.

As the laser beam 220 passes through the water, it induces plasmas 230. As explained in further detail below, the plasmas 230 emit signals 240 including sonar and electromagnetic signals that have a high directivity.

In the embodiment shown in FIG. 2, the focus controlling component 225 is a high energy phase mask that controls the focus of the laser beam 220 to have a three dimensional focal pattern with multiple foci at different locations. The multiple foci may have different intensities. The phase mask may include phase inducing components such as liquid crystals, deformable mirrors, holograms, etch crystals, etc.

Figure 3A:
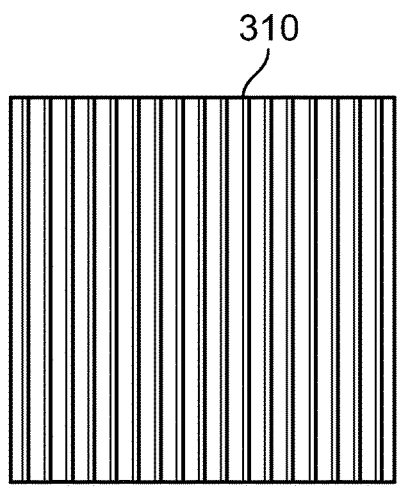
FIGS. 3A and 3C illustrate diffraction gratings for controlling a focus of a laser beam.
Figure 3B:
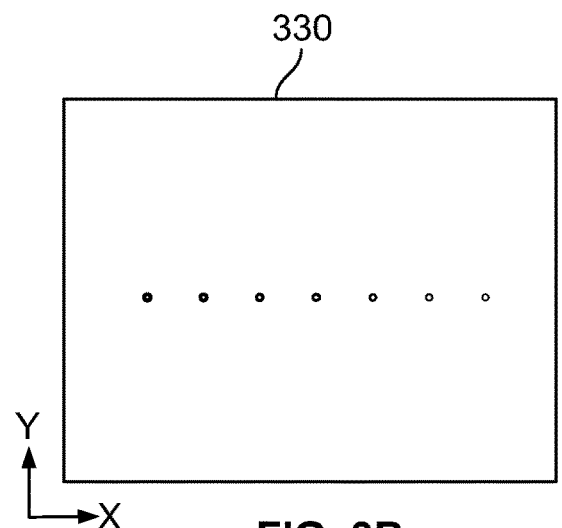
FIGS. 3B and 3D illustrate one-dimensional and two-dimensional focal patterns produced using the diffraction gratings shown in FIGS. 3A and 3C, respectively.
Figure 3C:
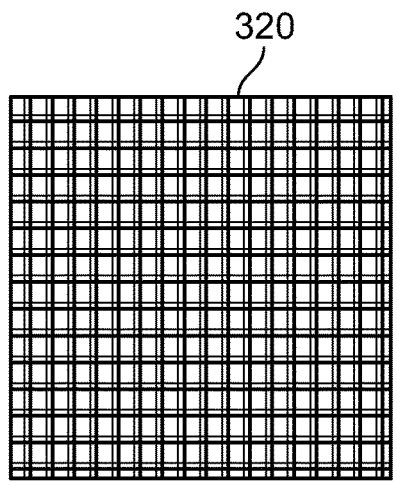
Figure 3D:
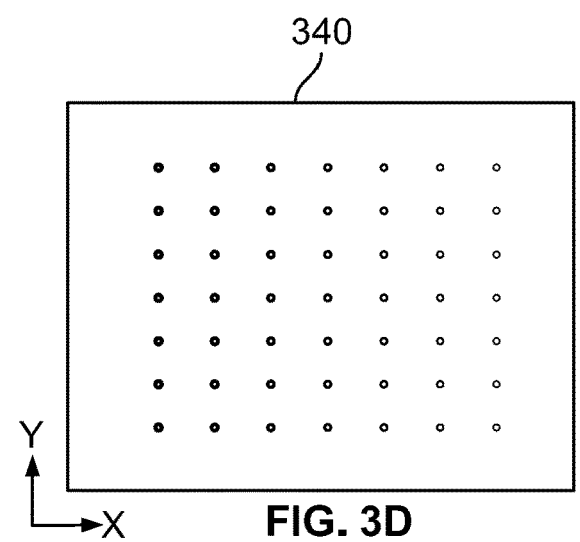

To aid in understanding of how phase inducing components may be used to control the focus of a laser beam, examples of liquid crystal Daman diffraction gratings are shown in FIGS. 3A and 3C. The diffraction grating 310 shown in FIG. 3A has a one-dimensional diffraction pattern, while the diffraction grating 320 shown in FIG. 3C has a two-dimensional diffraction pattern. The diffraction gratings cause the laser to focus at multiple points in a two dimensional plane. Passing a laser beam through the diffraction grating 310 shown in FIG. 3A causes the laser to have a focal pattern 330 having the foci along a single axis, e.g., an x axis, as shown in FIG. 3B. Passing a laser beam through the diffraction grating 320 shown in FIG. 3C causes the laser to have a focal pattern 340 having foci distributed in a two-dimensional array, e.g., foci distributed in the x-y plane as shown in FIG. 3D.

According to an illustrative embodiment, diffraction gratings such as those shown in FIGS. 3A and 3C may be combined to form a phase mask that allows the optical depth of the laser beam's focus to be extended. A phase mask allows the focal pattern of a laser to be controlled such that foci may be distributed not just in two dimensions but also in a third dimension, e.g., along the z axis.

Figure 4:
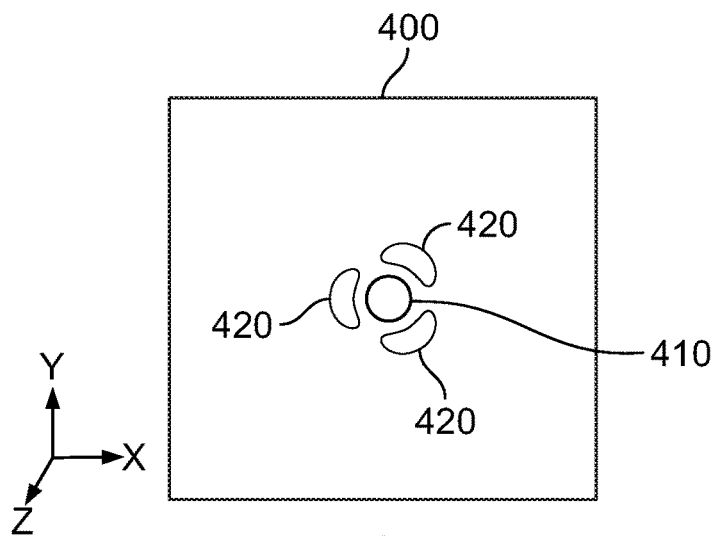
FIG. 4 illustrates a laser beam having multiple foci in an axial z direction.

This may be understood with reference to FIG. 4 which illustrates a laser beam having a focal pattern 400 with multiple foci in an axial z direction. For example, the "bright" spot 410 shown in FIG. 4 represents one focal point along the z axis, while the "dimmer" spots 420 represent another focal point along the z axis.

According to illustrative embodiments, controlling the focus of the laser beam to have a three dimensional focal pattern with multiple foci allows for control of the shape of the plasmas 230 induced by the laser as it passes through water. That is, as shown in FIG. 2, the plasmas 230 need not be circular like the plasmas 130 shown in FIG. 1. For example, as shown in FIG. 2, the plasmas 230 may be elliptical. It should be appreciated that the shape of the induced plasmas may be controlled to be any desired shape by selecting an appropriate focal pattern for the laser beam 220.

Figure 1:
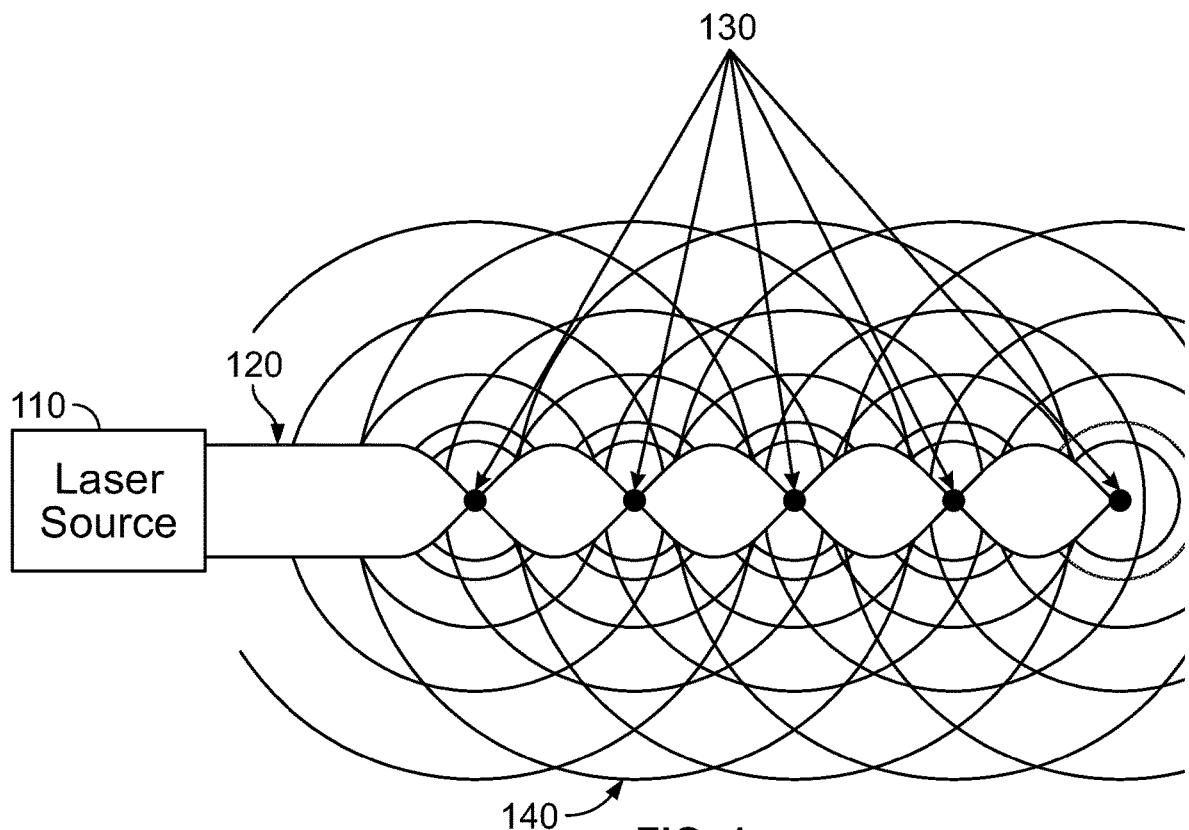
FIG. 1 illustrates a conventional system for generating a sonar source under water using a laser.

As the induced plasmas 230 are not circular, the sonar/electromagnetic signals 240 emitted from the plasmas 230 will not be isotropic (in the same direction) like the sonar/electromagnetic signals 140 shown in FIG. 1. Rather, the sonar/electromagnetic signals 240 emitted by the plasmas 230 will have a high directivity, radiating in different directions. The signals 240 will interfere with each other to produce a combined sonar/electromagnetic signal 250 that propagates in at least one certain desired direction, as indicated by the arrows on the combined sonar/electromagnetic signal 250.

The focal pattern of the laser beam 220 determines the shape of the plasmas 230, and the shape of the plasmas determine the directions of the emitted signals 240 and the direction of propagation of the combined signal 250 formed from the emitted signals. Thus, by selecting and adjusting the focal pattern using the focus controlling component 225, a user may select and adjust a direction of propagation of the combined signal. Accordingly, the laser beam may be used efficiently to control the direction of propagation of the combined signal.

According to one embodiment, the focus controlling component 225 is a phase mask that has a defined combination of gratings that cause the laser beam to have a three dimensional focal pattern. Gratings which individually would produce given focal patterns can be stacked to produce a new three dimensional focal pattern. Additional gratings can be added over and over to generate a fractal effect, thus causing the laser beam to have a fractal focal pattern.

Instead of or in addition to the gratings, the phase mask may include one or more spatial light modulators that cause the laser beam to have a focal pattern with multiple foci in the z-direction.

The gratings or spatial light modulators may be replaced or switched to alter the focal pattern of the laser beam and thus the propagation direction of the combined signal formed by the signals 240 emitted by the plasmas 230.

According to another embodiment, a computer controlled phase mask, such as a computer controlled spatial light modulator, can be utilized to change the phase mask design in real time. This allows the focal pattern of the laser beam to be altered in real time, thus altering the direction of propagation of the combined signal formed from the signals emitted by the plasmas 230.

An advantage of a phase mask is that the foci are generated simultaneously. However, although not shown in FIG. 2, it should be appreciated that a computer-controller rasterizer may be used instead of the phase mask to control the focus of the laser beam 220. A computer-controlled rasterizer is more design friendly than a phase mask as it does not require complex computations and experiments that are needed to design a phase mask that results in the desired three dimensional foci.

Figure 5:
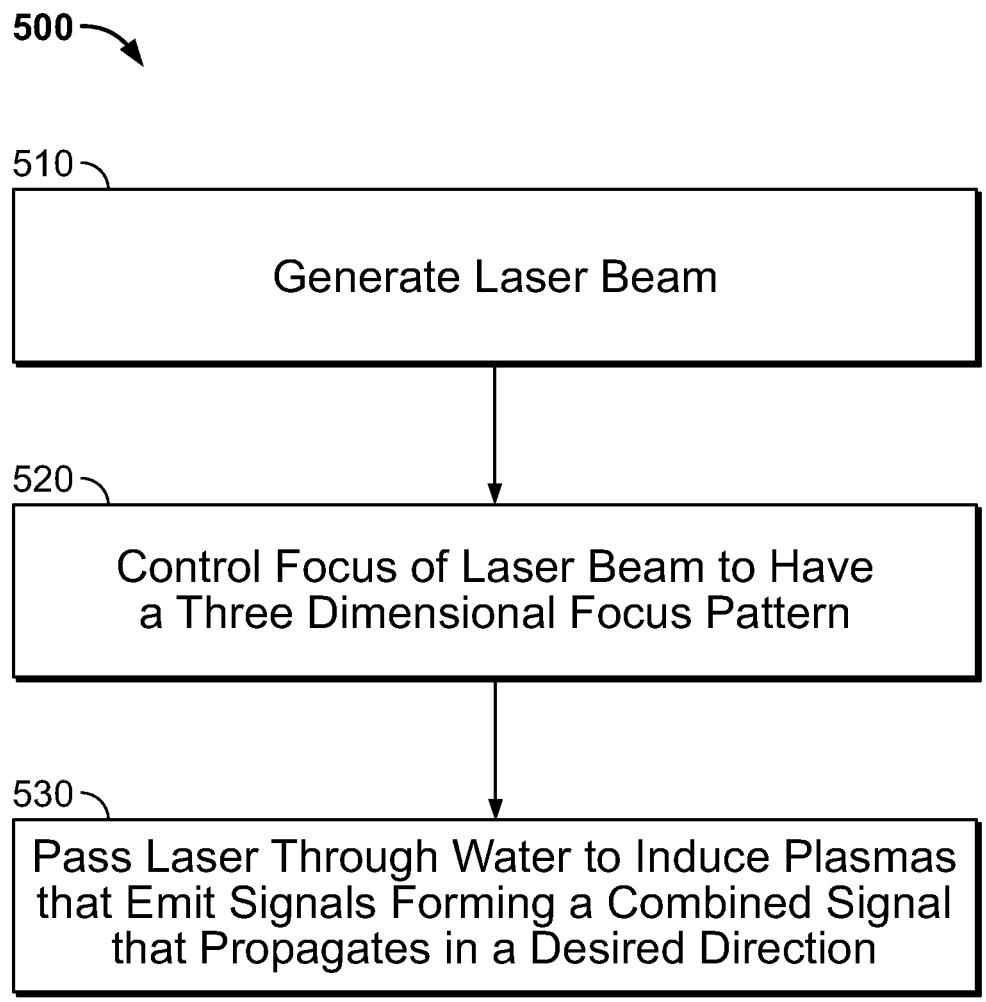
FIG. 5 is a flow chart depicting a process for generating a sonar source with high directivity according to an illustrative embodiment.

FIG. 5 is a flow chart showing steps of a process for generating a sonar source with high directivity according to an illustrative embodiment. It should be appreciated that the fewer, additional, or alternative steps may also be involved in the process and/or some steps may occur in a different order.

Referring to FIG. 5, the process 500 begins at step 510 at which a laser beam is generated by any suitable high power laser source, e.g., the laser source 210 shown in FIG. 2. At step 520, a focus of the laser beam is controlled to have a three dimensional focal pattern with multiple foci. This step may be performed by a focus controlling component, such as the phase mask focus controlling component 225 shown in FIG. 2. At step 530, the laser beam is passed through water to induce plasmas that emit signals that form a combined signal that propagates in a desired direction.

Although not shown, it should be appreciated that an additional step may be included for adjusting the focal pattern of the laser beam as desired so as to adjust the direction of propagation of the combined signal.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:
1. A device, comprising:
a focus controlling component configured to control a focus of a laser beam that passes through water and induces plasmas that emit signals, wherein the focus of the laser beam is controlled such that the signals emitted by the induced plasmas interfere to form a combined signal that propagates in a desired direction.

2. The device of claim 1, wherein the focus controlling component causes the focus of the laser beam to have a focal pattern that is three dimensional with multiple foci.

3. The device of claim 2, wherein the focus controlling component is configured to adjust the focal pattern of the laser beam to adjust the desired direction of propagation of the combined signal.

4. The device of claim 1, wherein the focus controlling component controls the focus of the laser beam such that the induced plasmas are shaped such that the emitted signals interfere to form the combined signal that propagates in the desired direction.

5. The device of claim 1, wherein the focus controlling component is a phase mask.

6. The device of claim 5, wherein the phase mask includes a computer controlled spatial light modulator.

7. The device of claim 5, wherein the phase mask includes multiple diffraction gratings.

8. The device of claim 7, wherein the multiple diffraction gratings control the focus of the laser beam such that the focal pattern has a fractal shape.

9. The device of claim 5, wherein the phase mask includes multiple liquid crystal spatial light modulators.

10. The device of claim 1, wherein the focus controlling component includes a computer-controlled beam rasterizer.

11. A system, comprising:
a laser source configured to generate and output a laser beam; and
a focus controlling component configured to control a focus of the laser beam to have a three dimensional focal pattern with multiple foci, such that as the laser beams passes through water, plasmas are induced that emit signals that interfere to form a combined signal that propagates in a desired direction.

12. The system of claim 11, wherein the plasmas emit sonar signals.

13. The system of claim 11, wherein the plasmas emit electromagnetic signals.

14. The system of claim 11, wherein the focus controlling component is a phase mask.

15. The system of claim 14, wherein the phase mask causes the multiple foci to be produced simultaneously.

16. The system of claim 15, wherein the phase mask includes at least one of a liquid crystal spatial light modulator, a deformable mirror, a hologram grating, and an etch crystal grating.

17. The system of claim 11, wherein the focus controlling component includes a computer-controlled beam rasterizer.

18. A method, comprising:
generating a laser beam;
controlling a focus of the laser beam to have a three dimensional focal pattern with multiple foci; and
passing the laser beam through water to induce plasmas that emit sonar signals, wherein the sonar signals interfere to form a combined sonar signal that propagates in a desired direction.

19. The method of claim 18, wherein the focus of the laser beam is controlled so that the induced plasmas are shaped to emit the sonar signals that interfere to form the combined sonar signal that propagates in the desired direction.

20. The method of claim 19, further comprising adjusting the direction of propagation of the combined sonar signal by adjusting the focal pattern.

* * * * *